(12) United States Patent
Chang et al.

(10) Patent No.: US 10,269,794 B2
(45) Date of Patent: Apr. 23, 2019

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Chai-Wei Chang, Hsinchu (TW); Po-Chi Wu, Zhubei (TW); Che-Cheng Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/785,271

(22) Filed: Oct. 16, 2017

(65) Prior Publication Data

US 2018/0138173 A1  May 17, 2018

Related U.S. Application Data

(63) Continuation of application No. 14/578,188, filed on Dec. 19, 2014, now Pat. No. 9,793,269.

(Continued)

(51) Int. Cl.
*H01L 21/02* (2006.01)
*H01L 27/088* (2006.01)
(Continued)

(52) U.S. Cl.
CPC .... *H01L 27/0886* (2013.01); *H01L 21/02068* (2013.01); *H01L 21/32134* (2013.01); *H01L 21/32137* (2013.01); *H01L 21/32138* (2013.01); *H01L 29/0649* (2013.01); *H01L 29/4232* (2013.01); *H01L 29/785* (2013.01); *H01L 21/823456* (2013.01)

(58) Field of Classification Search
None
See application file for complete search history.

(56) References Cited

U.S. PATENT DOCUMENTS

| 7,279,429 B1 | 10/2007 | Gabriel et al. |
| 7,320,908 B2 | 1/2008 | Son et al. |

(Continued)

FOREIGN PATENT DOCUMENTS

| DE | 102009047890 A1 | 3/2011 |
| JP | 2006005103 A | 1/2006 |

(Continued)

*Primary Examiner* — Reema Patel
*Assistant Examiner* — Steven Christopher
(74) *Attorney, Agent, or Firm* — Slater Matsil, LLP (57) ABSTRACT

In accordance with some embodiments, conductive material is removed from over a first plurality of fins and second plurality of fins, wherein the first plurality of fins is located within a small gate length region and the second plurality of fins is located in a large gate length region. The removal is performed by initially performed a dry etch with a low pressure and a high flow rate of at least one etchant, which causes the conductive material to have a larger thickness over the second plurality of fins than over the first plurality of fins. As such, when a wet etch is utilized to remove a remainder of the conductive material, dielectric material between the second plurality of fins and the conductive material is not damaged.

20 Claims, 9 Drawing Sheets

Related U.S. Application Data (60) Provisional application No. 62/034,451, filed on Aug. 7, 2014.

(51) Int. Cl.
| | | |
|---|---|---|
| *H01L 29/06* | (2006.01) | |
| *H01L 29/423* | (2006.01) | |
| *H01L 29/78* | (2006.01) | |
| *H01L 21/3213* | (2006.01) | |
| *H01L 21/8234* | (2006.01) | |

(56) References Cited

U.S. PATENT DOCUMENTS

| | | | |
|---|---|---|---|
| 7,538,368 B2 | 5/2009 | Yano | |
| 8,002,946 B2 | 8/2011 | Lewington et al. | |
| 8,268,184 B2 | 9/2012 | Ko et al. | |
| 8,487,378 B2 | 7/2013 | Goto et al. | |
| 8,716,079 B2 | 5/2014 | Heinrich et al. | |
| 8,729,634 B2 | 5/2014 | Shen et al. | |
| 8,826,213 B1 | 9/2014 | Ho et al. | |
| 8,860,148 B2 | 10/2014 | Hu et al. | |
| 8,887,106 B2 | 11/2014 | Ho et al. | |
| 8,941,153 B2* | 1/2015 | Lee | H01L 21/823431 257/288 |
| 2007/0004117 A1 | 1/2007 | Yagishita | |
| 2007/0190708 A1 | 8/2007 | Kaneko et al. | |
| 2008/0265338 A1 | 10/2008 | Yu et al. | |
| 2013/0017680 A1* | 1/2013 | Haran | H01L 29/66545 438/595 |
| 2014/0027859 A1 | 1/2014 | Gerhardt et al. | |
| 2014/0070320 A1 | 3/2014 | Mukherjee et al. | |
| 2014/0239404 A1* | 8/2014 | Huang | H01L 27/0924 257/369 |
| 2014/0282326 A1 | 9/2014 | Chen et al. | |
| 2015/0287809 A1 | 10/2015 | Kerber et al. | |

FOREIGN PATENT DOCUMENTS

| | | |
|---|---|---|
| KR | 20050089588 A | 9/2005 |
| KR | 20060004659 A | 1/2006 |
| KR | 20070101058 A | 10/2007 |
| KR | 20100078941 A | 7/2010 |
| KR | 20110056225 A | 5/2011 |
| KR | 20130115062 A | 10/2013 |
| WO | 2004100290 A2 | 11/2004 |

* cited by examiner

SEMICONDUCTOR DEVICE AND METHOD OF MANUFACTURE

PRIORITY CLAIM AND CROSS-REFERENCE

This application is a continuation of U.S. patent application Ser. No. 14/578,188, filed Dec. 19, 2014, entitled "Semiconductor Device and Method of Manufacture," which claims the benefit of U.S. Provisional Application Ser. No. 62/034,451, filed on Aug. 7, 2014, entitled "FinFET Device and Methods of Making Same," which applications are hereby incorporated herein by reference.

BACKGROUND

Semiconductor devices are used in a large number of electronic devices, such as computers, cell phones, and others. Semiconductor devices typically comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint desires of modern semiconductor processing, planar FETs may generally incur problems when reduced in size. Some of these problems include sub-threshold swing degradation, significant drain induced barrier lowering (DIBL), fluctuation of device characteristics, and leakage.

Fin field-effect transistors (FinFETs) have been studied to overcome some of these problems. However, FinFET transistors have their own drawbacks and issues during the manufacturing processes. Accordingly, research is currently being done to improve the manufacture of FinFETs in order to overcome problems as they are reduced in size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a removal of polysilicon from over a plurality of fins within a process to form finFET transistors. However, the embodiments described herein may be used in a wide variety of alternative removal processes.

Figure 1A:
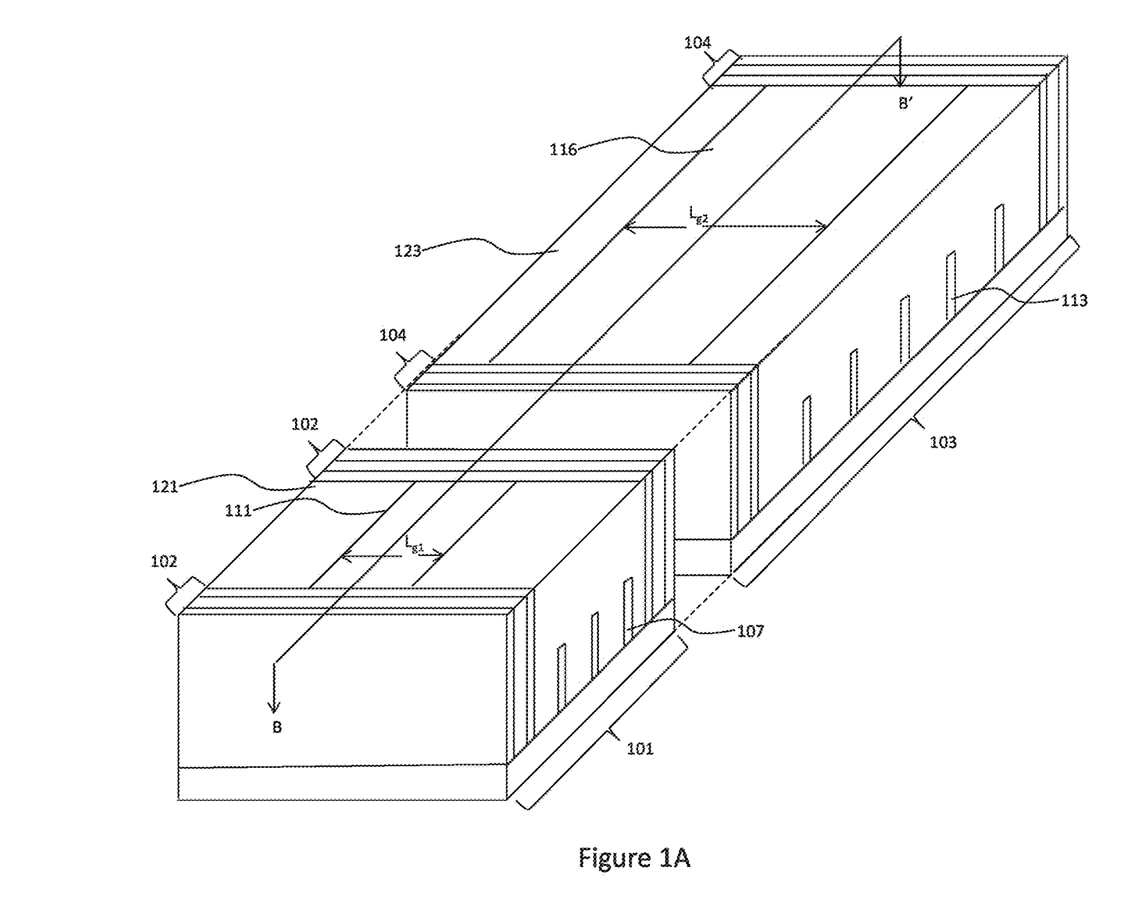
FIGS. 1A-1B illustrate a conductive material over fins, in accordance with some embodiments.
Figure 1B:
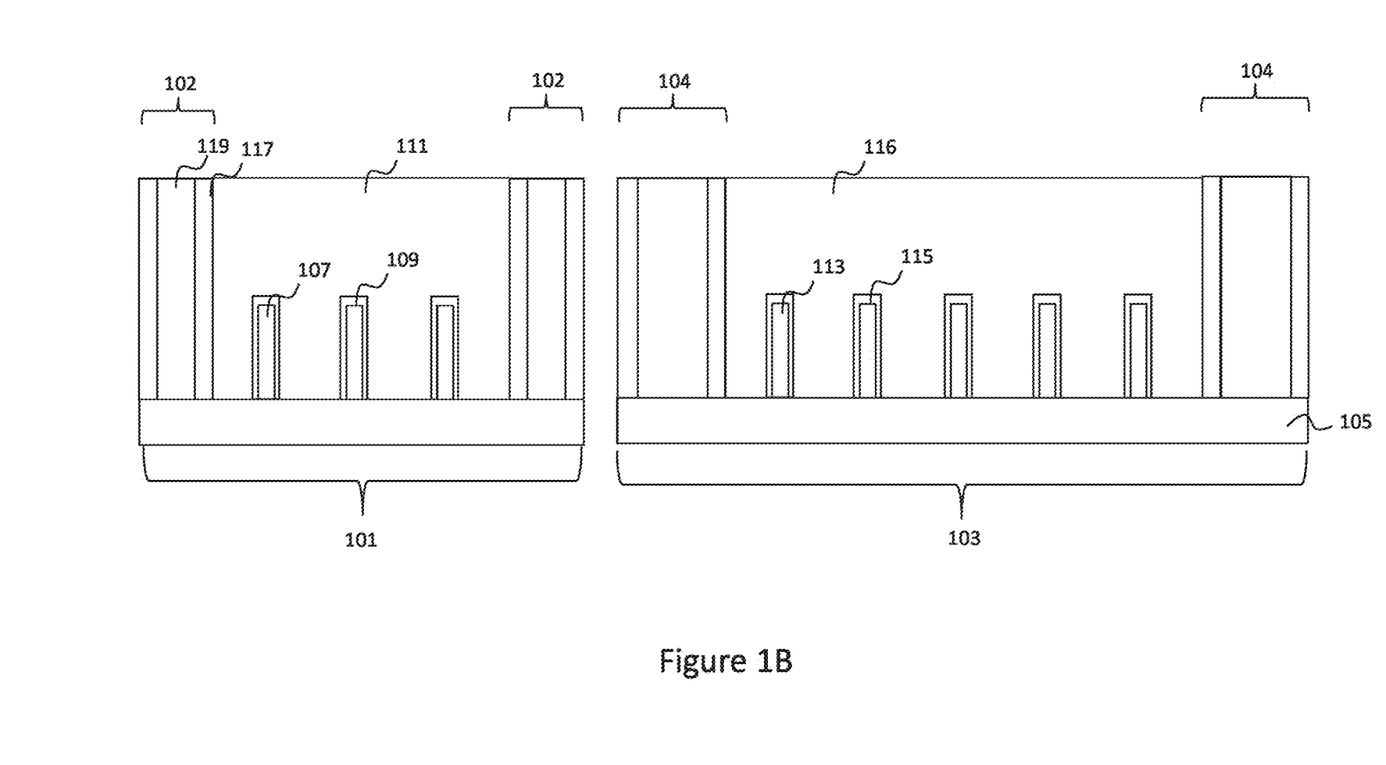

With reference now to FIGS. 1A-1B, wherein FIG. 1B is a cross-sectional view of FIG. 1A through line B-B', FIGS. 1A and 1B illustrate a first region 101 of a semiconductor substrate 105 and a second region 103 of the semiconductor substrate 105. In an embodiment the semiconductor substrate 105 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

In the first region 101 of the semiconductor substrate 105, semiconductor devices with a small gate length (Lg) will be formed. In an embodiment the semiconductor devices with a small gate length may be semiconductor devices, such as multiple gate transistors, that have a gate length of between about 5 nm and about 50 nm, such as about 16 nm.

In the second region 103 of the semiconductor substrate 105, semiconductor devices with a larger gate length than those devices within the first region 101 will be formed. In an embodiment the semiconductor devices may be, e.g., I/O devices with a larger gate length may have a gate length of, e.g., between about 51 nm and about 500 nm, such as about 240 nm. However, any suitable gate length may alternatively be utilized as long as it is longer than the semiconductor devices located within the first region 101.

First isolation regions 102 may be formed within the first region 101 of the semiconductor substrate 105 in order to separate the various regions of the semiconductor substrate 105, such as to separate the first region 101 from the second region 103. In an embodiment the first isolation regions 102 may be formed by initially etching the semiconductor substrate 105 to form one or more trenches within the semiconductor substrate 105. Once formed, the trenches may be lined with, e.g., a dielectric liner 117. The dielectric liner 117 may be, e.g., a dielectric material such as silicon oxide, silicon nitride, silicon oxynitride, combination of these, or the like, formed using a process such as thermal oxidation, chemical vapor deposition, physical vapor deposition, combinations of these or the like, although any suitable material and method of deposition may alternatively be utilized.

Once the trench has been lined with the dielectric liner 117, the remainder of the trench may be filled with a dielectric material 119 to form the first isolation regions 102. In an embodiment the dielectric material 119 may be an oxide material, a high-density plasma (HDP) oxide, or the like and may be deposited using a process such as chemical vapor deposition or physical vapor deposition, although any suitable material and method of manufacture may alternatively be utilized.

In an embodiment the dielectric material 119 may be deposited in order to fill and overfill the trenches, such that excess material of the dielectric material 119 may be located outside of the trenches and over the semiconductor substrate 105 at this point in the process. To remove excess material of the dielectric material 119 and isolate the dielectric material 119 within the trenches, a grinding or chemical mechanical polishing process may be utilized whereby etchants and abrasives are utilized in order to remove the excess material of the dielectric material 119 and planarize the dielectric material 119 with the semiconductor substrate 105.

Once the first isolation regions 102 have been formed, a first plurality of fins 107 may be formed within the first region 101. The first plurality of fins 107 may be formed from the semiconductor substrate 105 by initially forming a patterned mask (not individually illustrated in FIG. 1) over the semiconductor substrate 105 and the first isolation regions 102. The patterned mask may comprise a hard mask of one or more dielectric layers. For example, the hard mask may be a layer of a silicon dioxide or a silicon nitride formed by, for example, thermal oxidation, chemical vapor deposition (CVD), or the like. Alternatively, the hard mask may be formed of other dielectric materials, such as silicon oxynitride. A multi-layer hard mask, such as layers of silicon dioxide and silicon nitride, may also be used. Furthermore, other materials, such as a metal, a metal nitride, a metal oxide, or the like may be used. For example, the hard mask may be formed of tungsten.

The patterned mask is subsequently patterned using, for example, photolithography techniques. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to create the patterned mask to define the pattern of isolation trenches. Once the patterned mask has been formed, the first plurality of fins 107 may be formed using a subtractive etching process along with the patterned mask. For example, exposed portions of the semiconductor substrate 105 may be etched to form the first plurality of fins 107 from the semiconductor substrate 105. In an embodiment the semiconductor substrate 105 may be etched by, for example, $HBr/O_2$, $HBr/Cl_2/O_2$, or $SF_6/C_{12}$ plasma. In an embodiment the first plurality of fins 107 may be patterned such that it will eventually be used for a channel in a semiconductor device such as a multiple gate transistor with a small gate length.

Once the first plurality of fins 107 has been formed, a first gate dielectric 109 may be formed over the first plurality of fins 107. In an embodiment the first gate dielectric 109 may comprise a material such as silicon dioxide or silicon oxynitride with a thickness ranging from about 3 angstroms to about 100 angstroms, such as about 10 angstroms. The first gate dielectric 109 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the first gate dielectric 109. The first gate dielectric 109 may be formed using a process such as thermal oxidation, chemical vapor deposition, sputtering, or the like.

Once the first gate dielectric 109 has been formed, a first dummy gate material 111 may be formed over the first plurality of fins 107 and the first gate dielectric 109 and may be formed to fill and overfill the region between the first isolation regions 102. The first dummy gate material 111 may comprise a material, such as a doped or undoped poly-crystalline silicon (or amorphous silicon), a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials, combinations thereof, or the like. In an embodiment in which the first dummy gate material 111 is polysilicon, the first dummy gate material 111 may be formed by depositing doped or undoped polysilicon by low-pressure chemical vapor deposition (LPCVD) to a thickness in the range of about 400 Å to about 2,400 Å, such as about 1,400 Å.

Once the first dummy gate material 111 has been formed to fill and overfill the region between the first isolation regions 102, any excess material of the first dummy gate material 111 outside of the region between the first isolation regions 102 may be removed and the first dummy gate material 111 may be planarized with a top surface of the first isolation regions 102. In an embodiment the excess first dummy gate material 111 may be removed using a chemical mechanical polishing (CMP) process, whereby etchants and abrasives are utilized along with a grinding pad to react and grind away excess material until the first dummy gate material 111 is planar with the first isolation regions 102. However, other suitable planarization methods, such as grinding or one or more etching processes, may alternatively be utilized.

After being planarized, the first dummy gate material 111 may be patterned into a shape that will eventually be utilized to define a first gate electrode 501 (not illustrated in FIGS. 1A-1B but illustrated and discussed below with respect to FIG. 5). In an embodiment the first dummy gate material 111 may be patterned to have a first gate length ($L_{g1}$) that is the small gate length of between about 5 nm and about 50 nm, such as about 16 nm. The first dummy gate material 111 may be patterned using, e.g., a photolithographic process whereby a photoresist is applied, irradiated, and developed to form a mask, and the mask is then utilized to remove exposed portions of the first dummy gate material 111 thereby exposing the underlying first gate dielectric 109.

Optionally at this point, exposed portions of the first gate dielectric 109 may be removed in order to expose the underlying first plurality of fins 107. In an embodiment the exposed portions of the first gate dielectric 109 (those portions that are not covered by the first dummy gate material 111) may be removed using a dry etch process and the first dummy gate material 111 as a mask. However, any suitable process may alternatively be utilized.

Once the first gate dielectric 109 has been patterned, first spacers 121 may be formed. The first spacers 121 may be formed on opposing sides of the first dummy gate material 111 and the first gate dielectric 109. In an embodiment the first spacers 121 are formed by blanket depositing a spacer layer (not shown) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The first spacers 407 may then be patterned, such as by one or more etches to remove the spacer layer from the horizontal surfaces of the structure.

In the second region 103, second isolation regions 104, a second plurality of fins 113, a second gate dielectric 115, and a second dummy gate material 116 may be placed in a process to eventually form active devices, such as multiple gate transistors which have a large gate length. In an embodiment the second isolation regions 104, the second plurality of fins 113, the second gate dielectric 115, and the second dummy gate material 116 may be formed similarly to the first isolation regions 102, the first plurality of fins 107, the first gate dielectrics 109, and the first dummy gate material 111 as described above. Additionally, in some embodiments the second isolation regions 104, the second plurality of fins 113, the second gate dielectric 115 and the second dummy gate material 116 are formed simultaneously with the first isolation regions 102, the first plurality of fins 107, the first gate dielectrics 109, and the first dummy gate material 111, although any suitable method may alternatively be used.

However, once the second dummy gate material 116 has been formed and planarized with the second isolation regions 104, the second dummy gate material 116 may be patterned to form a shape that will eventually be used to define second gate electrodes 503 (not illustrated in FIGS. 1A-1B but illustrated and described below with respect to FIG. 5). In an embodiment the second dummy gate material 116 is patterned to have a second gate length ($L_{g2}$) that is the large gate length of between about 51 nm and about 500 nm, such as about 240 nm.

Once the second dummy gate material 111 has been patterned, second spacers 123 may be formed on opposing sides of the second dummy gate material 116. In an embodiment the second spacers 123 may be formed in a similar fashion and from similar materials as the first spacers 121 described above. However, any suitable process may alternatively be utilized.

Figure 2:
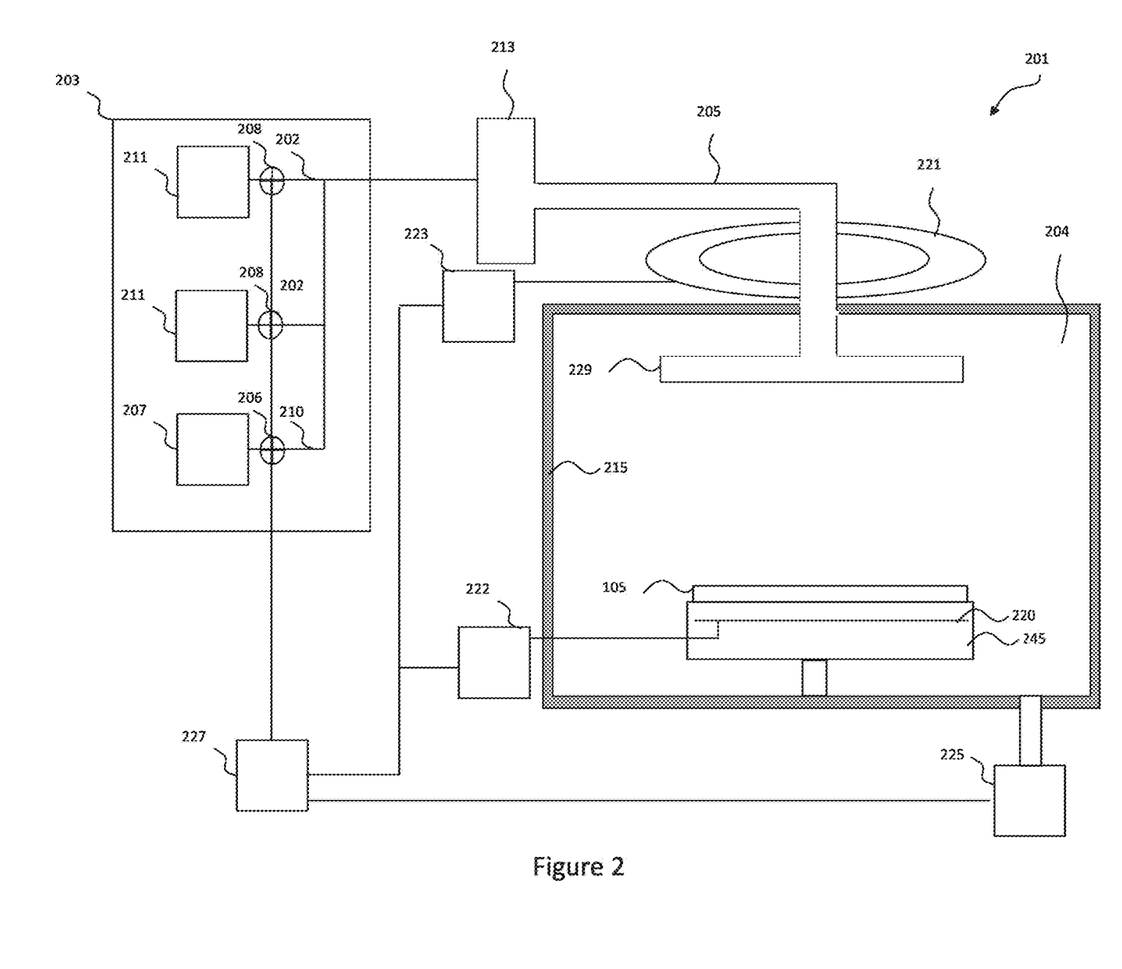
FIG. 2 illustrates an etching chamber, in accordance with some embodiments.

FIG. 2 illustrates a start of a process to remove the first dummy gate material 111 and the second dummy gate material 116 by placing the semiconductor substrate 105 (along with the first dummy gate material 111 and the second dummy gate material 116) into an etching system 201 such as the one illustrated in FIG. 2. In an embodiment the etching system 201 may comprise an etchant delivery system 203 that may deliver one or more gaseous etchants to an etching chamber 204. The etchant delivery system 203 supplies the various desired etchants to the etching chamber 204 through an etchant controller 213 and a manifold 205. The etchant delivery system 203 may also help to control the flow rate of the etchant into the etching chamber 204 by controlling the flow and pressure of a carrier gas through the etchant delivery system 203.

In an embodiment the etchant delivery system 203 may include a plurality of etchant suppliers 211 along with a carrier gas supply 207. Additionally, while only two etchant suppliers 211 are illustrated in FIG. 2, this is done merely for clarity, as any suitable number of etchant suppliers 211, such as one etchant supplier 211 for each etchant desired to be used within the etching system 201. For example, in an embodiment in which five separate etchants will be utilized, there may five separate etchant suppliers 211.

Each of the individual etchant suppliers 211 may be a vessel, such as a gas storage tank, that is located either locally to the etching chamber 204 or remotely from the etching chamber 204. Alternatively, the etchant supplier 211 may be a facility that independently prepares and delivers the desired etchants. Any suitable source for the desired etchants may be utilized as the etchant supplier 211, and all such sources are fully intended to be included within the scope of the embodiments.

In an embodiment the individual etchant suppliers 211 supply an etchant to the etchant controller 213 through first lines 202 with first valves 208. The first valves 208 are controlled by a controller 227 that controls and regulates the introduction of the various etchants and carrier gases to the etching chamber 204.

A carrier gas supply 207 may supply a desired carrier gas, or diluent gas, that may be used to help push or "carry" the various desired etchants to the etching chamber 204. The carrier gas may be an inert gas or other gas that does not react with the etchant itself or with by-products from the etchant's reactions. For example, the carrier gas may be nitrogen ($N_2$), helium (He), argon (Ar), combinations of these, or the like, although other suitable carrier gases may alternatively be utilized.

The carrier gas supply 207, or diluent supply, may be a vessel, such as a gas storage tank, that is located either locally to the etching chamber 204 or remotely from the etching chamber 204. Alternatively, the carrier gas supply 207 may be a facility that independently prepares and delivers the carrier gas to the etchant controller 213. Any suitable source for the carrier gas may be utilized as the carrier gas supply 207, and all such sources are fully intended to be included within the scope of the embodiments. The carrier gas supply 207 may supply the desired carrier gas to the etchant controller 213 through a second line 210 with a second valve 206 that connects the carrier gas supply 207 to the first lines 202. The second valve 206 is also controlled by the controller 227 that controls and regulates the introduction of the various etchants and carrier gases to the etching chamber 204. Once combined, the lines may be directed towards the etchant controller 213 for a controlled entry into the etching chamber 204.

The etching chamber 204 may be any desired shape that may be suitable for dispersing the etchant and contacting the etchant with the semiconductor substrate 105. In the embodiment illustrated in FIG. 2, the etching chamber 204 has a cylindrical sidewall and a bottom. However, the etching chamber 204 is not limited to a cylindrical shape, and any other suitable shape, such as a hollow square tube, an octagonal shape, or the like, may alternatively be utilized. Furthermore, the etching chamber 204 may be surrounded by an etchant chamber housing 215 made of material that is inert to the various process materials. As such, while the etchant chamber housing 215 may be any suitable material that can withstand the chemistries and pressures involved in the etching process, in an embodiment the etchant chamber housing 215 may be steel, stainless steel, nickel, aluminum, alloys of these, combinations of these, and the like.

Additionally, the etching chamber 204 and the mounting platform 245 may be part of a cluster tool system (not shown). The cluster tool system may be used in conjunction with an automated handling system in order to position and place the semiconductor substrate 105 into the etching chamber 204 prior to the etching process, position and hold the semiconductor substrate 105 during the etching processes, and remove the semiconductor substrate 105 from the etching chamber 204 after the etching processes.

Within the etching chamber 204 is located a mounting platform 245 in order to position and control the semiconductor substrate 105 during the etching process. The mounting platform 245 may hold the semiconductor substrate 105 using a combination of clamps, vacuum pressure, and/or electrostatic forces, and may also include heating and cooling mechanisms in order to control the temperature of the semiconductor substrate 105 during the processes. In a particular embodiment the mounting platform 245 may comprise four cooling zones, such as an inner temperature zone, a middle inner temperature zone, a middle outer temperature zone, and an outer temperature zone (not individually illustrated) in order to heat and cool the semiconductor substrate 105 during the etching process. The various temperature zones may use gaseous or liquid heat transfer materials to precisely control the temperature of the semiconductor substrate 105 during the etching process, although any suitable number of heating or cooling zones may alternatively be utilized.

The mounting platform 245 may additionally comprise a first electrode 220 coupled to a first RF generator 222. The first electrode 220 may be electrically biased by the first RF generator 222 (under control of the controller 227) at a RF voltage during the etching process. By being electrically biased, the first electrode 220 is used to provide a bias to the incoming etchants and assist to ignite them into a plasma. Additionally, the first electrode 220 is also utilized to maintain the plasma during the etching process by maintaining the bias.

Furthermore, while a single mounting platform 245 is illustrated in FIG. 2, this is merely intended for clarity and is not intended to be limiting. Rather, any number of mounting platforms 245 may additionally be included within the etching chamber 204. As such, multiple semiconductor substrates may be etched during a single etching process.

Additionally, the etching chamber 204 comprises a showerhead 229. In an embodiment the showerhead 229 receives the various etchants from the manifold 205 and helps to disperse the various etchants into the etching chamber 204. The showerhead 229 may be designed to evenly disperse the etchants in order to minimize undesired process conditions that may arise from uneven dispersal. In an embodiment the showerhead 229 may have a circular design with openings dispersed evenly around the showerhead 229 to allow for the dispersal of the desired etchants into the etching chamber 204.

The etching chamber 204 also comprises an upper electrode 221, for use as a plasma generator. In an embodiment the plasma generator may be a transformer coupled plasma generator and may be, e.g., a coil. The coil may be attached to a second RF generator 223 that is utilized to provide power to the upper electrode 221 (under control of the controller 227) in order to ignite the plasma during introduction of the reactive etchants.

However, while the upper electrode 221 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may alternatively be utilized. All such methods are fully intended to be included within the scope of the embodiments.

The etching chamber 204 may also be connected to a vacuum pump 225. In an embodiment the vacuum pump 225 is under the control of the controller 227, and may be utilized to control the pressure within the etching chamber 204 to a desired pressure. Additionally, once the etching process is completed, the vacuum pump 225 may be utilized to evacuate the etching chamber 204 in preparation for removal of the semiconductor substrate 105.

To begin to remove the first dummy gate material 111 and the second dummy gate material 116, the process may be started by placing the semiconductor substrate 105 onto the mounting platform 245. Once in place, an initial cleaning process may be performed in order to remove any undesired residues (e.g., silicon nitride) and any undesired oxidation materials from the exposed surfaces of the first dummy gate material 111 and the second dummy gate material 116. In an embodiment the initial cleaning process may be performed by initially lowering the pressure of the etching chamber 204 to a pressure of between about 3 mtorr and about 7 mtorr, such as about 5 mtorr. Additionally, the temperature zones within the mounting platform 245 may be set such that the inner temperature zone is between about 20° C. and about 60° C., such as about 40° C., the middle inner temperature zone is set to between about 20° C. and about 60° C., such as about 40° C., the middle outer temperature zone is set to between about 35° C. and about 75° C., such as about 55° C., and the outer temperature zone is set to between about 40° C. and about 80° C., such as about 60° C.

Once the temperature and pressure have been set, the initial cleaning process may be begun by the controller 227 connecting one of the etchant suppliers 211 to the etching chamber 204 and directing a first cleaning etchant such as CF4 to the manifold 205 and into the etching chamber 204. In an embodiment the controller 227 may additionally add a first diluent or first carrier gas such as argon along with the first cleaning etchant. The first cleaning etchant may be introduced at a rate of between about 10 sccm and about 30 sccm, such as about 20 sccm while the first diluent may be introduced at a rate of between about 30 sccm and about 50 sccm, such as about 40 sccm.

Within the etching chamber 204, the first cleaning etchant may be ignited into a plasma for a reactive ion etch process. In an embodiment the first cleaning etchant may be ignited by the controller 227 sending a signal to the second RF generator 223 to supply to the upper electrode 221 a power of between about 150 W and about 250 W, such as about 200 W. Additionally, the transformer-coupled capacitive tuning (TCCT) parameter may be set to between about 0.1 and about 1.0, such as about 0.2. The controller 227 may also send a signal to the first RF generator 222 in order to supply a bias to the first electrode 220. In an embodiment the first RF generator 222 supplies a bias of between about 40 V and about 80 V, such as about 60 V, and an equal injection ratio is utilized.

Once the plasma has been ignited, the process conditions as described above are maintained in order to expose the first dummy gate material 111 and the second dummy gate material 116 to the plasma generated within the etching chamber 204. In an embodiment the process conditions are maintained and the first dummy gate material 111 and the second dummy gate material 116 are exposed for a time period of between about 5 seconds and about 20 seconds, such as about 12 seconds.

After the initial cleaning process has been performed, the etchant controller 213 may stop the flow of the first cleaning etchant and the first diluent from entering the etching chamber 204, stopping the initial cleaning process. Once the initial cleaning process has been stopped, the conditions within the etching chamber 204 may be modified either prior to or during the introduction of a first etching combination of etchants. In an embodiment the conditions within the etching chamber 204 may be modified to have a low pressure, such as a pressure between about 5 mtorr and about 20 mtorr, such as about 11 mtorr. Additionally, the temperature zones within the mounting platform 245 may be set such that the inner temperature zone is between about 25° C. and about 65° C., such as about 45° C., the middle inner temperature zone is set to between about 25° C. and about 65° C., such as about 45° C., the middle outer temperature zone is set to between about 25° C. and about 65° C., such as about 45° C., and the outer temperature zone is set to between about 25° C. and about 65° C., such as about 45° C.

After the conditions within the etching chamber 204 have been modified, the controller 227 may initiate the first etching process by connecting one or more of the etchant suppliers 211 and another one of the carrier gas suppliers 207 to the etching chamber 204 to introduce the first etching combination of etchants. While the precise etchants utilized is dependent at least in part upon which material is utilized for the first dummy gate material 111 and the second dummy gate material 116, in an embodiment in which the first dummy gate material 111 and the second dummy gate material 116 are polysilicon, the first etching combination of etchants may comprise a combination of hydrogen bromide (HBr) and oxygen ($O_2$) along with a second diluent such as nitrogen ($N_2$). In an embodiment the oxygen is introduced at a rate of between about 2 sccm and about 10 sccm, such as about 5 sccm, and the nitrogen is introduced at a rate of between about 5 sccm and about 25 sccm, such as about 15 sccm.

Additionally, the hydrogen bromide may be introduced at a high flow rate in order to assist in the removal of the first dummy gate material 111 relative to the second dummy gate material 116 (as described further below with respect to FIG. 3). In an embodiment the hydrogen bromide may be introduced at the high flow rate of between about 100 sccm and about 500 sccm, such as about 300 sccm.

Within the etching chamber 204, the first etching combination of etchants may be ignited into a plasma for the reactive ion etch process. In an embodiment the first etching combination of etchants may be ignited by the controller 227 sending a signal to the second RF generator 223 to supply to the upper electrode 221 a power of between about 150 W and about 550 W, such as about 350 W. Additionally, the transformer-coupled capacitive tuning (TCCT) parameter may be set to between about 0.1 and about 2.6, such as about 1.9. The controller 227 may also send a signal to the first RF generator 222 in order to supply a bias to the first electrode 220. In an embodiment the first RF generator 222 supplies a bias of between about 60 V and about 180 V, such as about 130 V, and an equal injection ratio is utilized.

Once the plasma has been ignited, the process conditions as described above are maintained in order to expose the first dummy gate material 111 and the second dummy gate material 116 to the plasma generated within the etching chamber 204 and remove an exposed portion of the first dummy gate material 111 and the second dummy gate material 116. In an embodiment the process conditions are maintained and the first dummy gate material 111 and the second dummy gate material 116 are exposed and etched for a time period of between about 10 seconds and about 30 seconds, such as about 22 seconds.

Once the etching process has been performed to a desired length, the controller 227 may stop the flow of the first etching combination of etchants from entering the etching chamber 204, stopping the first etching process. Once the etching process has been stopped, the conditions within the etching chamber 204 may be modified either prior to or during the introduction of a cleaning etch combination of etchants. In an embodiment the conditions within the etching chamber 204 may be modified to have a pressure of between about 30 mtorr and about 130 mtorr, such as about 80 mtorr. Additionally, the temperature zones within the mounting platform 245 may be set such that the inner temperature zone is between about 30° C. and about 70° C., such as about 50° C., the middle inner temperature zone is set to between about 15° C. and about 55° C., such as about 35° C., the middle outer temperature zone is set to between about 15° C. and about 55° C., such as about 35° C., and the outer temperature zone is set to between about 20° C. and about 60° C., such as about 40° C.

After the conditions within the etching chamber 204 have been modified, the controller 227 may initiate a second cleaning etch by connecting one or more of the etchant suppliers 211 and another one of the carrier gas suppliers 207 to the etching chamber 204 to introduce a cleaning combination of etchants. While the precise etchants utilized is dependent at least in part upon which the materials chosen, in an embodiment in which the first dummy gate material 111 and the second dummy gate material 116 are polysilicon, the cleaning combination of etchants may comprise a combination of nitrogen trifluoride ($NF_3$) and chlorine ($Cl_2$) along with a third diluent such as helium. In an embodiment the nitrogen trifluoride is introduced at a rate of between about 2 sccm and about 10 sccm, such as about 5 sccm, the chlorine is introduced at a rate of between about 50 sccm and about 130 sccm, such as about 90 sccm, and the helium is introduced at a rate of between about 100 sccm and about 300 sccm, such as about 200 sccm.

Within the etching chamber 204, the cleaning combination of etchants may be ignited into a plasma for the reactive ion etch process. In an embodiment the cleaning combination of etchants may be ignited by the controller 227 sending a signal to the second RF generator 223 to supply to the upper electrode 221 a power of between about 500 W and about 950 W, such as about 750 W. Additionally, the transformer-coupled capacitive tuning (TCCT) parameter may be set to between about 0.1 and about 1.0, such as about 0.2, and an equal injection ratio is utilized.

In an embodiment the controller 227 may apply a bias of zero to the first electrode in order to assist in cleaning any sidewall residue that may remain on the sidewalls during the removal of the first dummy gate material 111 and the second dummy gate material 116. In particular, the controller 227 may also send a signal to the first RF generator 222 to shut off the voltage to the first electrode 220, thereby providing the zero bias.

Once the plasma has been ignited, the process conditions as described above are maintained in order to expose the first dummy gate material 111 and the second dummy gate material 116 to the plasma generated within the etching chamber 204. In an embodiment the process conditions are maintained and the first dummy gate material 111 and the second dummy gate material 116 are exposed and cleaned for a time period of between about 5 seconds and about 12 seconds, such as about 7 seconds.

Figure 3:
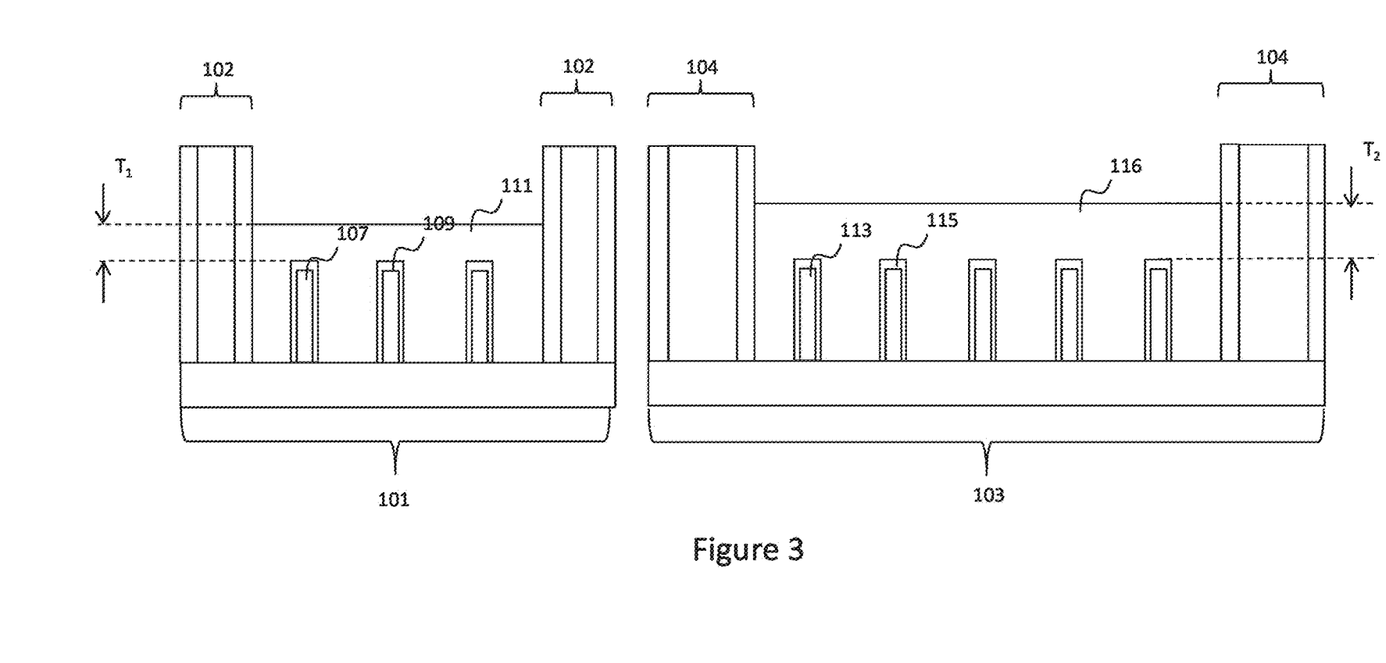
FIG. 3 illustrates an etching process to recess the conductive material, in accordance with some embodiments.

Looking now at FIG. 3, FIG. 3 illustrates the first dummy gate material 111 and the second dummy gate material 116 after the initial cleaning process, the first etching process, and the second cleaning etch described above with respect to FIG. 2. Because of the first etching process, portions of the first dummy gate material 111 and the second dummy gate material 116 have been removed such that the first dummy gate material 111 and the second dummy gate material 116 has been recessed below the first isolation region 102 and the second isolation region 104, respectively.

However, by using the combination of a low-pressure and a high flow rate that is used during the first etching process, the loading of the dry etching process may be reversed. In particular, previous etching processes caused a differential in etching rates between the first region 101 and the second region 103 such that the first dummy gate material 111 in the first region 101 had a larger thickness than the second dummy gate material 116 in the second region 103, leading to a negative loading between the first dummy gate material 111 and the second dummy gate material 116.

However, by using the low-pressure/high flow rate etching process, the first etching process described herein will remove a larger thickness of the first dummy gate material 111 than the second dummy gate material 116. For example, in an embodiment in which the first dummy gate material 111 has an initial height of 660 Å over the first gate dielectric 109 and the second dummy gate material 116 has an initial height of 708 Å over the second gate dielectric 115, the first dummy gate material 111 may be recessed about 459 Å and the second dummy gate material 116 may be recessed about 435 Å, for a positive loading of about 24 Å. In another embodiment in which the first dummy gate material 111 has an initial height of 727 Å over the first gate dielectric 109 and the second dummy gate material 116 has an initial height of 753 Å over the second gate dielectric 115, the first dummy gate material 111 may be recessed about 496 Å and the second dummy gate material 116 may be recessed about 475 Å, for a positive loading of about 21 Å.

For example, in an embodiment in which the first plurality of fins 107 and the second plurality of fins 113 are the same height, the first dummy gate material 111 will have a first thickness $T_1$ over the first gate dielectric 109 of between about 10 Å and about 500 Å, such as about 190 Å. However, within the second region 103 of the semiconductor substrate 105, the second dummy gate material 116 may have a second thickness $T_2$ that is greater than the first thickness $T_1$, such as by being between about 10 Å and about 500 Å, such as about 210 Å.

Figure 4:
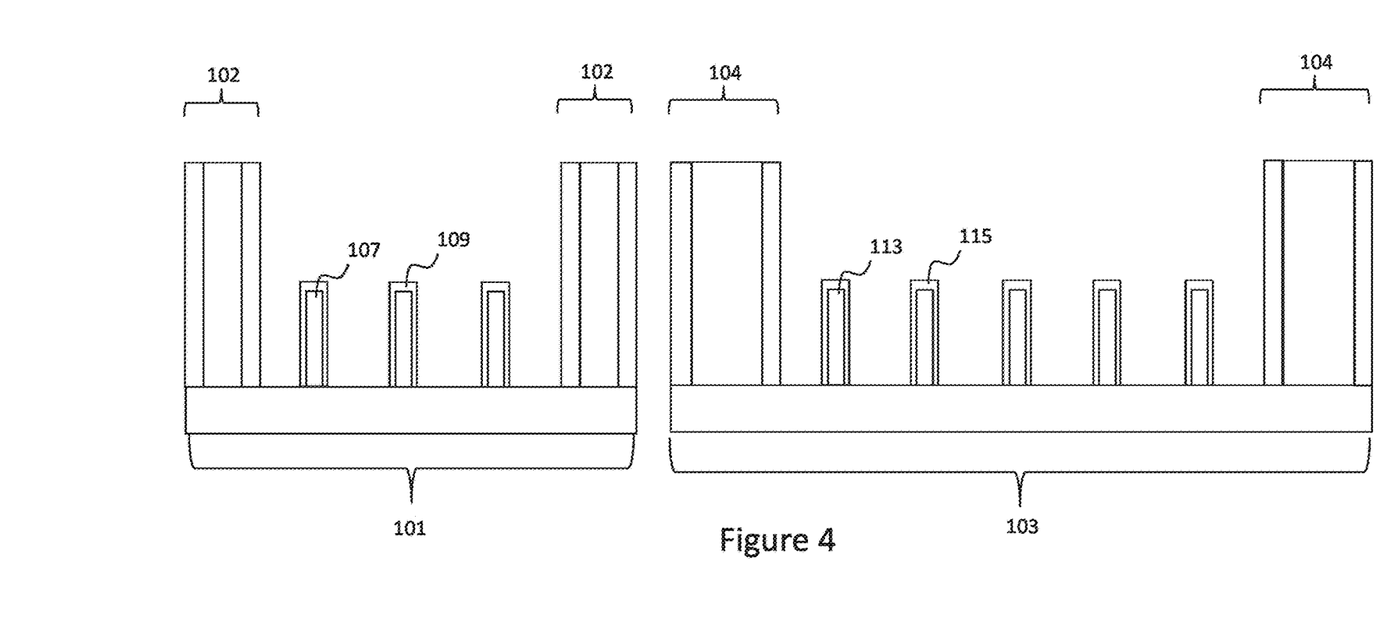
FIG. 4 illustrates a wet etch to remove a remainder of the conductive material, in accordance with some embodiments.

FIG. 4 illustrates a second etching process utilized after the first etching process to remove the remainder of the first dummy gate material 111 and the second dummy gate material 116 from over the first plurality of fins 107 and the second plurality of fins 113. In an embodiment the second etching process may be a wet etching process, whereby liquid etchants are applied to the first dummy gate material 111 and the second dummy gate material 116 in order to remove the first dummy gate material 111 and the second dummy gate material 116. The liquid etchant may be applied using a dipping process, a spray-on process, a puddle process, combinations of these, or the like, may alternatively be utilized.

In an embodiment the liquid etchant is chosen to remove the first dummy gate material 111 and the second dummy gate material 116. As such, the precise liquid etchant is dependent at least in part upon the materials chosen for the first dummy gate material 111 and the second dummy gate material 116. However, in a particular embodiment in which the first dummy gate material 111 and the second dummy gate material 116 comprise polysilicon, the liquid etchants may include $NH_4OH:H_2O_2:H_2O$ (APM), $NH_2OH$, KOH, $HNO_3:NH_4F:H_2O$, and/or the like. Additionally, the liquid etchant may be applied at a temperature of between about 10° C. and about 60° C., such as about 45° C. for a time of between about 50 seconds and about 200 seconds, such as about 140 seconds.

However, because the second dummy gate material 116 over the second plurality of fins 113 is thicker than the first dummy gate material 111 over the first plurality of fins 107, the wet etching process may be ended as soon as the second dummy gate material 116 is fully removed instead of having to continue the wet etch to ensure that all of the first dummy gate material 111 has been removed in circumstances when the first dummy gate material 111 is thicker than the second dummy gate material 116. By being able to stop the wet etch process at this time, damage that would otherwise occur during the wet etch process may be avoided. In particular, when etch processes are utilized that cause the first dummy gate material 111 over the first plurality of fins 107 to have a larger thickness than the second dummy gate material 116 over the second plurality of fins 113, the wet etch that is utilized to ensure that all of the first dummy gate material 111 is removed from over the first plurality of fins 107 will remove all of the second dummy gate material 116 from over the second plurality of fins 113 and then proceed to damage the underlying second gate dielectric 115.

However, by performing the etching process as described above with respect to FIG. 2, there is a larger thickness of the second dummy gate material 116 to remove than the first dummy gate material 111. As such, there is no need to continue the wet etch past the point at which the second dummy gate material 116 has been removed (as the first dummy gate material 111 has already been removed), and the process can be halted prior to damage occurring on the underlying second gate dielectric 115, leaving the second gate dielectric 115 in an "as deposited" condition. By reducing the amount of damage caused by the removal of the second dummy gate material 116, the voltage breakdown can be better controlled, and the overall reliability of the finFETs may be improved. This allows for a larger process window and a larger reliability when manufacturing damage free devices for mass production.

Figure 5:
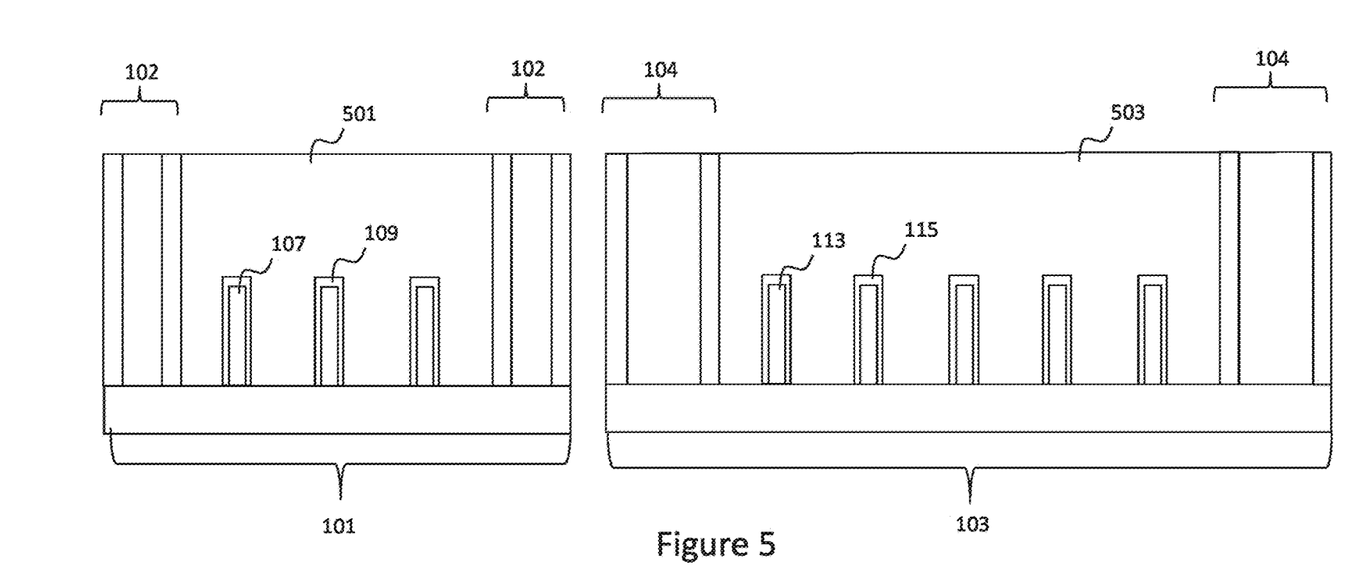
FIG. 5 illustrates a deposition of gate electrode material, in accordance with some embodiments.

FIG. 5 illustrates that, once the first dummy gate material 111 and the second dummy gate material 116 have been removed, a first gate electrode 501 and a second gate electrode 503 are formed to replace the first dummy gate material 111 and the second dummy gate material 116. In an embodiment the first gate electrode 501 and the second gate electrode 503 are formed of a material that is suitable for the device for which they will be utilized. In an embodiment in which the first gate electrode 501 and the second gate electrode 503 will be used for an NMOS device (along with associated source/drain regions within the semiconductor substrate 105), the first gate electrode 501 and the second gate electrode 503 may comprises a gate electrode material suitable for an NMOS device, such as aluminum, titanium, titanium aluminum, or tantalum may be utilized. However, any other suitable conductive material, such as aluminum silicon copper or aluminum copper, may alternatively be utilized. In an embodiment the first gate electrode 501 and the second gate electrode 503 may be formed using, e.g., a deposition process. The deposition process will continue until the openings left by the removal of the first dummy gate material 111 and the second dummy gate material 116 have been filled and/or overfilled.

Once filled, a planarization process is performed in order to remove excess material that is located outside of the openings left by the first dummy gate material 111 and the second dummy gate material 116. In an embodiment the planarization process may be a CMP process, in which chemicals and abrasives are utilized to react and grind the material of the first gate electrode 501 and the second gate electrode 503 to remove and planarize the first gate electrode 501 and the second gate electrode 503 with the first spacers 121 and the second spacer 123 to form the first gate electrode 501 and the second gate electrode 503. However, any suitable planarization process may alternatively be utilized.

Figure 6A:
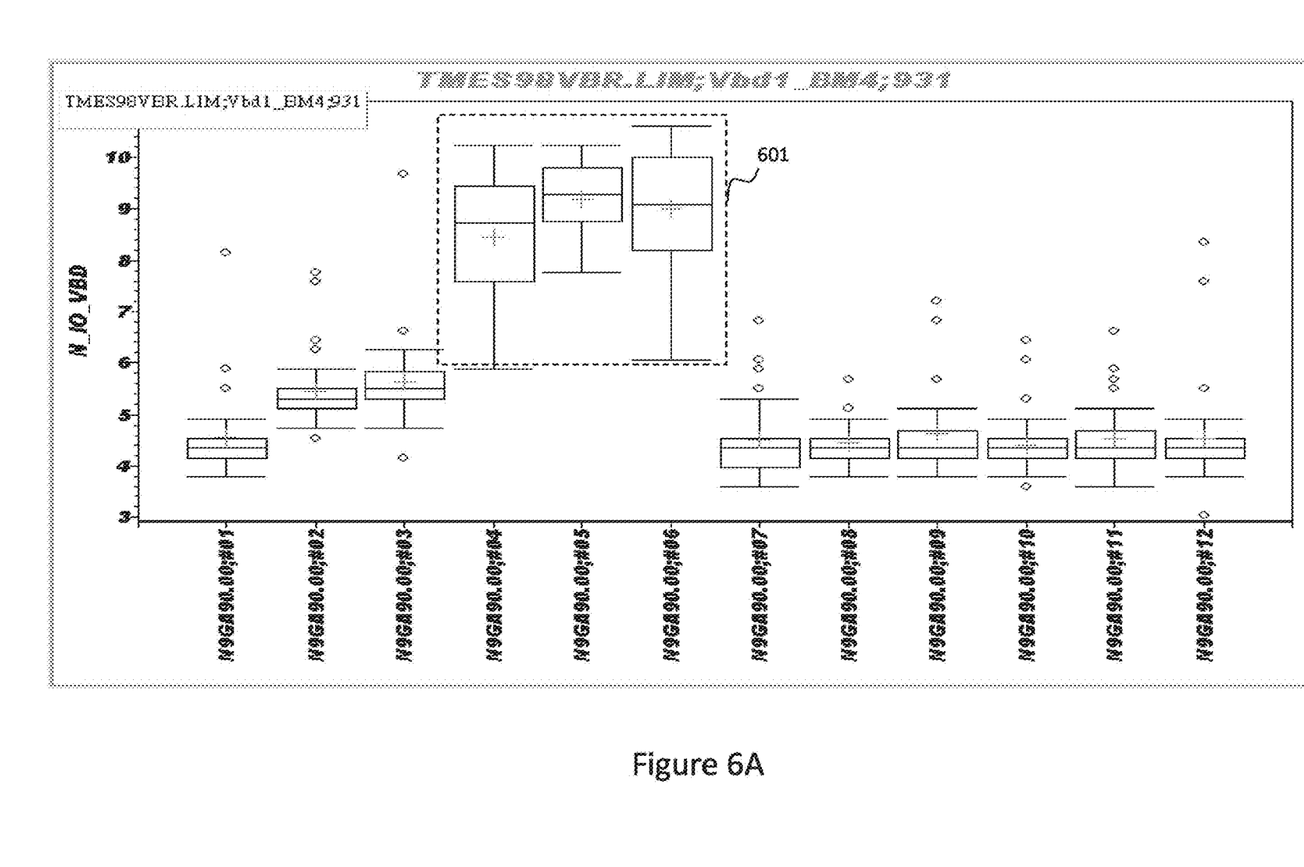
FIGS. 6A-6C illustrate charts that show the improvement and testing of embodiments, in accordance with some embodiments.

FIG. 6A illustrates a chart of breakdown voltages utilizing the above described process and its improvements over the other types of dry etch/wet etch combinations. Looking first at FIG. 6A, the horizontal axis illustrates different test runs performed on different wafers, with runs 4-6 being runs utilizing embodiments described herein. Runs 1-3 and 7-12 illustrate devices manufactured without the embodiments described herein. Along the vertical axis is charted the breakdown voltage of NMOS IO devices. As can be seen in these tests, the low pressure, high flow dry etch process (represented in FIG. 6A by the box labeled 601) allows for the formation of devices with significant improvements over other etching processes. For example, while the other etching processes cannot get above 6 volts, devices utilizing the low pressure, high flow dry etch in combination with the wet etch are consistently above 7.

Figure 6B:
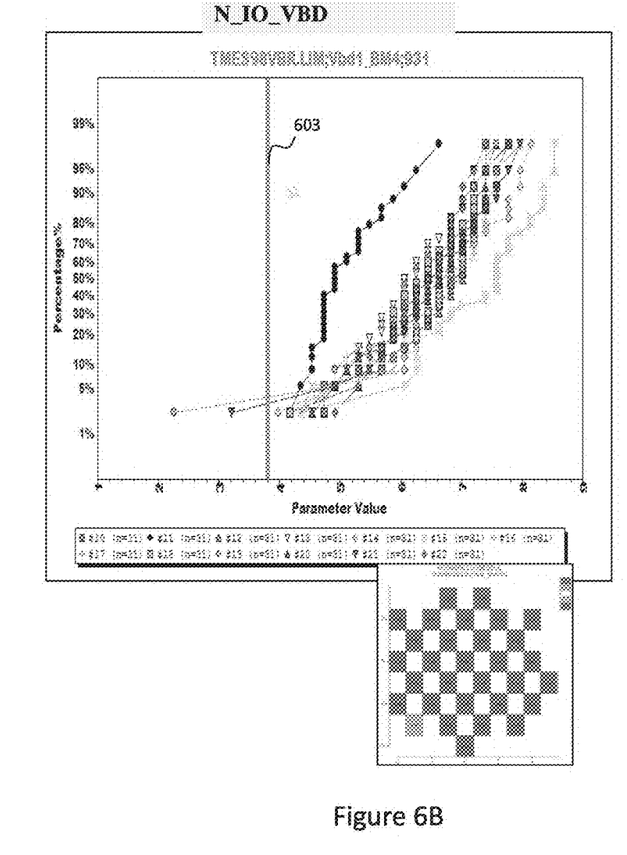

FIG. 6B illustrates a chart of additional testing on devices that utilize the low pressure, high flow dry etch process. In this chart the horizontal axis illustrates a parameter value of breakdown voltage from 1 volt to 9 volts, while the vertical axis represents percentage of passing for devices formed on wafers. Each of the curves within the chart represents one wafer that has been formed using low pressure, high flow dry etch process described herein. Additionally, the line labeled 603 represents a pass-fail threshold, wherein wafers that remain above the line 603 pass. As can be seen, the wafers utilizing the low pressure, high flow dry etch process easily pass the breakdown voltage test.

Figure 6C:
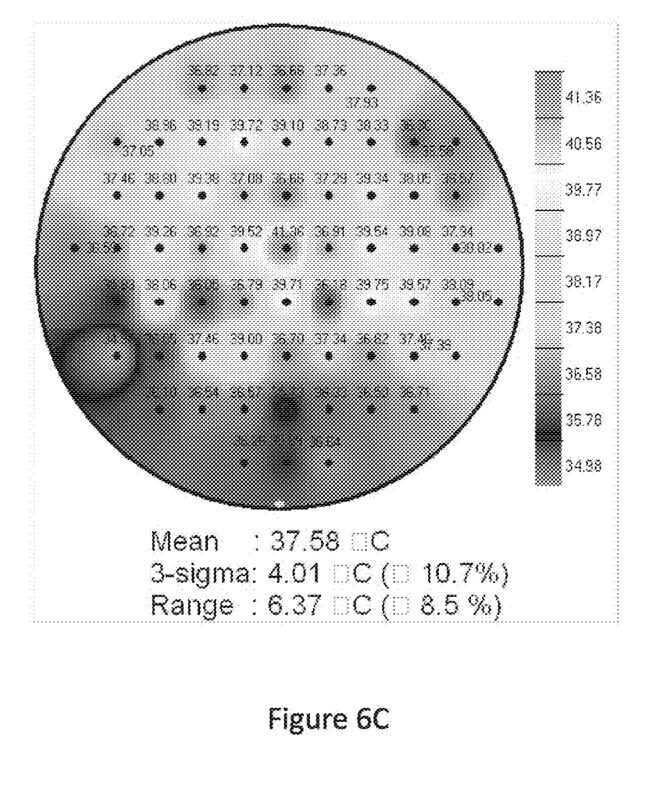

FIG. 6C illustrates a testing results that illustrate the across-wafer distribution of the remaining poly using the low pressure, high flow dry etch process. As can be seen, across an entire wafer, the amount of poly remaining after the low pressure, high flow dry etch process may be between 34.98 nm and 41.36 nm.

In accordance with an embodiment, a semiconductor device comprising a semiconductor substrate with a first region and a second region, wherein the first region comprises first fins for a short gate length device and the second region comprises second fins for a large gate length device. A first dummy material is over the first region, the first dummy material extending a first distance away from the semiconductor substrate. A second dummy material over the second region, the second dummy material extending a second distance away from the semiconductor substrate, the second distance being greater than the first distance.

In accordance with another embodiment, a semiconductor device comprising a first plurality of fins over a semiconductor substrate and a second plurality of fins over the semiconductor substrate is provided. A first dielectric material is over the first plurality of fins, and a second dielectric material is over the second plurality of fins, wherein the first dielectric material has a first thickness over the first plurality of fins that is less than a second thickness of the second dielectric material over the second plurality of fins.

In accordance with yet another embodiment, a semiconductor device comprising a first isolation region isolating a first region of a semiconductor substrate is provided. A first plurality of fins is within the first region of the semiconductor substrate, and first gate dielectrics are over respective ones of the first plurality of fins, wherein the first gate dielectrics have a first gate length. A first dummy material is aligned with and over the first gate dielectrics, the first dummy material extending a first distance from the first gate dielectrics in a first direction perpendicular to a major surface of the semiconductor substrate. A second isolation region isolates a second region of the semiconductor substrate. A second plurality of fins is within the second region of the semiconductor substrate, wherein the second plurality of fins has a same height as the first plurality of fins. Second gate dielectrics are over respective ones of the second plurality of fins, wherein the second gate dielectrics have a second gate length greater than the first gate length. A second dummy material is aligned with and over the second gate dielectrics, the second dummy material extending a second distance in the first direction from the second gate dielectrics greater than the first distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first conductive material over a first fin and a second conductive material over a second fin, wherein the first fin is located in a small gate length region and the second fin is located in a large gate length region; and
   performing a dry etch on the first conductive material and the second conductive material, wherein the dry etch is performed at a low pressure and with a high flow rate of at least one etchant such that the first conductive material is recessed further than the second conductive material.

2. A method of manufacturing a semiconductor device, the method comprising:
   forming a first plurality of fins with a first channel length in a first region of a semiconductor substrate;
   forming a second plurality of fins with a second channel length greater than the first channel length in a second region of the semiconductor substrate;
   depositing polysilicon over the first plurality of fins and the second plurality of fins;

recessing the polysilicon with a dry etching process, wherein the dry etching process is performed at a low pressure and with a high flow rate of at least one etchant; and removing a remainder of the polysilicon, wherein the removing the remainder of the polysilicon is performed at least in part with a wet etching process.

3. The method of claim 1, wherein the low pressure is between about 5 mtorr and about 20 mtorr.

4. The method of claim 1, wherein the high flow rate is between about between about 100 sccm and about 500 sccm.

5. The method of claim 1, wherein the at least one etchant is hydrogen bromide.

6. The method of claim 1, wherein the first conductive material comprises polysilicon.

7. The method of claim 1, wherein after the performing the dry etch the first conductive material and the second conductive material have a positive loading of between about 21 Å and about 24 Å.

8. The method of claim 1, further comprising performing a wet etching process on the first conductive material and the second conductive material after the performing the dry etch.

9. The method of claim 2, wherein after the recessing the polysilicon and prior to the removing the remainder of the polysilicon, a first portion of the polysilicon and a second portion of the polysilicon have a positive loading of between about 21 Å and about 24 Å.

10. The method of claim 2, further comprising depositing a gate dielectric prior to the depositing the polysilicon.

11. The method of claim 10, wherein after the removing the remainder of the polysilicon the gate dielectric is in an as-deposited condition.

12. The method of claim 2, further comprising performing a first cleaning process prior to the recessing the polysilicon.

13. The method of claim 12, wherein the performing the first cleaning process is performed in a first chamber and the recessing the polysilicon is performed in the first chamber.

14. A method of manufacturing a semiconductor device, the method comprising:

depositing a first dummy gate material over a first fin and a second dummy gate material over a second fin, wherein the first fin is located in a small gate length region and the second fin is located in a large gate length region; and performing a dry etch to recess the first dummy gate material and the second dummy gate material, wherein the dry etch is performed at a low pressure and with a high flow rate of at least one etchant in order to recess the first dummy gate material further than the second dummy gate material.

15. The method of claim 14, wherein the low pressure is between about 5 mtorr and about 20 mtorr.

16. The method of claim 15, wherein the high flow rate is between about between about 100 sccm and about 500 sccm.

17. The method of claim 14, further comprising an initial cleaning process separate from the low pressure, high flow dry etch.

18. The method of claim 17, wherein the initial cleaning process is a plasma process.

19. The method of claim 18, wherein the initial cleaning process is performed in a first chamber and the performing the dry etch is performed in the first chamber.

20. The method of claim 18, further comprising performing a wet etching process to remove the first dummy gate material.

* * * * *

UNITED STATES PATENT AND TRADEMARK OFFICE
CERTIFICATE OF CORRECTION

PATENT NO. : 10,269,794 B2  
APPLICATION NO. : 15/785271  
DATED : April 23, 2019  
INVENTOR(S) : Chai-Wei Chang Page 1 of 1

It is certified that error appears in the above-identified patent and that said Letters Patent is hereby corrected as shown below:

In the Claims

In Column 15, Line 11, Claim 4, delete "between about between about" and insert --between about--.

In Column 16, Line 21, Claim 16, delete "between about between about" and insert --between about--.

Signed and Sealed this  
Third Day of September, 2019

Andrei Iancu  
*Director of the United States Patent and Trademark Office*